(12) United States Patent
Su et al.

(10) Patent No.: US 7,381,646 B2
(45) Date of Patent: Jun. 3, 2008

(54) METHOD FOR USING A CU BEOL PROCESS TO FABRICATE AN INTEGRATED CIRCUIT (IC) ORIGINALLY HAVING AN AL DESIGN

(75) Inventors: Jiannong Su, Shanghai (CN); Simon Shi-ning Yang, Portland, OR (US); Jian Zhang, Arcadia, CA (US)

(73) Assignee: Chartered Semiconductor Manufacturing, Ltd., Singapore (SG)

( * ) Notice: Subject to any disclaimer, the term of this patent is extended or adjusted under 35 U.S.C. 154(b) by 380 days.

(21) Appl. No.: 11/161,722

(22) Filed: Aug. 15, 2005

(65) Prior Publication Data

US 2007/0037394 A1    Feb. 15, 2007

(51) Int. Cl.
*H01L 21/44* (2006.01)

(52) U.S. Cl. ............... 438/687; 438/597; 257/E21.477; 716/3

(58) Field of Classification Search ................ 438/597, 438/687; 257/E21.476, E21.477; 716/3
See application file for complete search history.

(56) References Cited

U.S. PATENT DOCUMENTS

| | | | |
|---|---|---|---|
| 5,904,557 A | 5/1999 | Komiya et al. | |
| 6,028,362 A | 2/2000 | Omura | |
| 6,086,454 A | 7/2000 | Watanabe et al. | |
| 6,117,775 A | 9/2000 | Kondo et al. | |
| 6,140,239 A | 10/2000 | Avanzino et al. | |
| 6,169,034 B1 | 1/2001 | Avanzino et al. | |
| 6,218,290 B1 | 4/2001 | Schonauer et al. | |
| 6,261,952 B1 | 7/2001 | Ngo et al. | |
| 6,265,781 B1 | 7/2001 | Andreas | |
| 6,303,551 B1 | 10/2001 | Li et al. | |
| 6,503,834 B1 | 1/2003 | Chen et al. | |
| 6,730,982 B2 | 5/2004 | Barth et al. | |
| 7,260,810 B2* | 8/2007 | Filippi, Jr. et al. ............ 716/20 |
| 2002/0142592 A1* | 10/2002 | Barth et al. ................. 438/687 |
| 2004/0219783 A1 | 11/2004 | Ahn et al. | |
| 2007/0011632 A1* | 1/2007 | Yang .............................. 716/5 |
| 2007/0037384 A1* | 2/2007 | Su et al. ..................... 438/637 |

\* cited by examiner

*Primary Examiner*—Michael S. Lebentritt
*Assistant Examiner*—Angel Roman
(74) *Attorney, Agent, or Firm*—Horizon IP Pte Ltd

(57) ABSTRACT

A semiconductor fabrication method or process is provided for fabricating an integrated circuit (IC) originally having an Al backend design using a Cu BEOL fabrication process. The method converts the Al backend design to a Cu backend design without redesigning the IC for Cu BEOL fabrication process, and uses the resultant Cu design to fabricate the IC using Cu BEOL fabrication process. The Al-Cu conversion first determines layer construction of the Al design, and then matches metal resistances of the Al design with metal resistances of a Cu design, matches intra-metal capacitances of the Al design with intra-metal capacitances of the Cu design, and matches inter-metal capacitance of the Al design with inter-metal capacitances of the Cu design.

29 Claims, 8 Drawing Sheets

Step 1

Step 2

Step 3

Step 4

METHOD FOR USING A CU BEOL PROCESS TO FABRICATE AN INTEGRATED CIRCUIT (IC) ORIGINALLY HAVING AN AL DESIGN

CROSS-REFERENCE TO RELATED APPLICATIONS

The present application is related to commonly assigned U.S. patent application, entitled "A Method for Processing IC Designs for Different Metal BEOL Processes", filed on even date.

BACKGROUND

1. Field of the Invention

The present invention relates generally to the field of semiconductors, particularly to manufacturing methods for fabricating semiconductor devices, and more particularly to the Back-End-Of-Line (BEOL) semiconductor manufacturing process.

2. Description of the Prior Art

The semiconductor manufacturing process, when likened to an assembly line, includes two major components, namely the Front-End-of-Line (FEOL) which includes the multilayer process of the actual forming of semiconductor devices (transistors, etc.) on a semiconductor substrate, and the Back-End-Of-Line (BEOL) which includes the metallization after the semiconductor devices have been formed. Like all electronic devices, semiconductor devices in a microchip such as an integrated circuit (IC) need to be electronically connected through wiring. In an integrated circuit, such wiring is done through multilayer metallization on top of the multilayered semiconductor devices formed on the semiconductor substrate. The complexity of this wiring becomes immediately appreciable once one realizes that there are usually hundreds of millions or more semiconductor devices (transistors in particular) formed on a single IC, and all these semiconductor devices need to be properly connected. This is accomplished by multilayer metallization, with each metallization layer designated as Metal 1, Metal 2, so on, where Metal 1 is the metallization layer closest to the underlying semiconductor devices to provide local connections among neighboring devices, and other metallization layers provide increasingly global connections from Metal 2 to the top metallization layer. Each metallization layer consists of a grid of metal lines sandwiched between dielectric layers for electrical integrity. Modern semiconductor manufacturing process can involve six or more metallization layers.

Although in the early years of semiconductor industry BEOL was generally less important than FEOL, the recent advancements have changed that equation. Microchip interconnect technology has become a critical challenge for future IC advancements due to the increasing difficulties to reduce signal propagation delay or interference caused by the increasingly dense interconnects. The problem is particularly acute considering that while an increase of metallization density means longer signal delays caused by the interconnects, a corresponding increase of transistor density means shorter signal traveling time between local semiconductor devices, making metallization increasingly a bottleneck in enhancing IC performance.

Enhancements in integrated circuit (IC) density and performance as predicted by Moore's Law have fueled the semiconductor industry and resultant Information Revolution for over 40 years. The fabrication of deep submicron Ultra-Large Scale Integrated (ULSI) circuits requires long interconnects having small contacts and small cross-sections. In the past generation of semiconductor manufacturing process technology (industry generally considers 0.13 µm a boundary), aluminum (Al) and Al alloys have been used as conventional chip wiring materials while tungsten (W) has been used as contact plug between metal layers. The newer generation of the semiconductor manufacturing process technology has made it necessary to replace the Al technology with a technology based on a different metal. The introduction of copper (Cu) metallization served as an enabler for aggressive interconnects scaling due to its lower resistivity (e.g., the effective resistivity of TaCu in a 1 µm line is ~2.2 µΩ-cm) as compared with traditional Al metallization (e.g., the effective resistivity of Ti/Al(Cu)/Ti in a 1 µm line is ~3.3 µΩ-cm) as well as improved reliability (such as less electromigration) and reduced steps of fabrication.

The transition from Al technology to Cu technology has been dramatic. After years of development activities, Cu technology first started to be implemented in some advanced ICs such as microprocessors, but since then has quickly swept nearly the entire semiconductor manufacturing industry. In addition to the technological mandate for Cu technology as discussed above, the phenomenon of the rapid Cu dominance also has to do with the dynamics and the economy of semiconductor manufacturing industry. For example, because it is generally less expensive to maintain a single type of manufacturing line than to maintain two different types of manufacturing lines with one line implementing Al technology and the other Cu technology, semiconductor manufacturers generally choose to complete the Al to Cu transition in a sweeping manner, even though there are still many product designs that could be adequately manufactured using the conventional Al technology. Currently, most of chipmakers have simply moved from Al interconnect to Cu interconnect fabrication (BEOL backend of line process) by following semiconductor roadmap when they are ready for 0.13 µm technology or below. With Cu technology becoming more mature, continue to invest in Al process is no longer desirable or even practical since it will add tremendous overhead to operations and facility managements. In addition, Al process can only be utilized up to 0.15 µm and clearly has a limited service life span, making further investments by chipmakers in the desolating technology more difficult.

On the other hand, the semiconductor manufacturing industry has gone a step ahead of the product/application industry in the Al-to-Cu transition. Most chipmakers or fabrication service providers serve a broad range of customers having a variety of products, many of which have been designed based on Al technology. From a standpoint of the product design alone, many of these Al designs need not be fabricated using 0.13 µm (or below) technology and thus need not be designed based on Cu process. This led to an undesirable situation where a company that has a product design based on Al process will have to either redesign the product for Cu process or find a chipmaker who still maintains a production line based on Al technology, which is becoming increasingly more difficult or less economical.

SUMMARY OF THE INVENTION

This invention provides a method for using a Cu BEOL fabrication process to fabricate an integrated circuit (IC) originally having an Al backend design. The method converts the Al backend design to a Cu backend design without redesigning the IC for Cu BEOL fabrication process. The conversion includes steps of (1) obtaining/determining layer construction of the Al backend design; (2) constructing primitive layer construction of a Cu backend design according to the layer construction of the Al backend design; (3) matching metal resistances of the Cu backend design with metal resistances of the Al backend design; (4) matching intra-metal capacitances of the Cu backend design with intra-metal capacitances of the Al backend design; and (5) matching inter-metal capacitance of the Cu backend design with inter-metal capacitances of the Al backend design. Upon the conversion, the method fabricates the IC based on the obtained Cu backend design using Cu BEOL fabrication process.

In one embodiment, the layer construction has parameters including metal thicknesses, thicknesses of inter-layer dielectric layers (ILD), thicknesses of inter-metal dielectric layers (IMD) and dielectric constant of each dielectric material (ILD or IMD).

In one embodiment, matching metal resistances of the Cu backend design with metal resistances of the Al backend design comprises scaling Cu thicknesses. Scaling Cu thicknesses may be accomplished by determining a copper thickness corresponding to an Al thickness based on comparing Cu resistivity with Al resistivity, or by determining a Cu thickness corresponding to an Al thickness based on a simulation result (such as SPICE model simulation) of a model for the Cu backend design.

In one embodiment, matching intra-metal capacitances of the Cu backend design with intra-metal capacitances of the Al backend design comprises tuning an effective dielectric constant of intra-metal dielectric layers. Tuning the effective dielectric constant of intra-metal dielectric layers may be accomplished by adjusting a thickness of a nitride layer, or by inserting a nitride layer having a calculated thickness.

In one embodiment, matching inter-metal capacitance of the Cu backend design with inter-metal capacitances of the Al backend design comprises tuning an effective dielectric constant of inter-metal dielectric layers. Tuning the effective dielectric constant of an inter-metal dielectric layers may be accomplished by adjusting a thickness of a dielectric layer.

Converting the Al backend design to the Cu backend design may further includes steps of verifying the Cu backend design with a layout rule check tool to identify a violation and fixing the violation identified if there is any. Verifying the Cu backend design may include identifying any violations of a maximum metal width rule or a maximum metal density rule. Fixing the violation identified may be accomplished by slotting a portion of Cu metallization involved in the violation, or by adjusting a Cu thickness determined in matching metal resistances of the Cu backend design with metal resistances of the Al backend design. Verifying the Cu backend design may also include identifying any violations of a minimum metal width rule or a minimum metal density rule. Fixing the violation identified may be accomplished by inserting dummy Cu metallization. In other embodiments, verifying the Cu backend design comprises identifying any violations of a metal size rule, a via size rule, a metal-metal spacing rule, a metal-via spacing rule, a minimum via/metal enclosure rule, or a minimum metal/via overlay rule.

Converting the Al backend design to the Cu backend design may further includes steps of: generating layout of the Cu backend design, checking the layout with a Design-Rule Checking (DRC) tool, placing model/rule-based Optical Proximity Correction (OPC), and verifying mask layer generation.

The present invention is also a process for using Cu BEOL to fabricate an integrated circuit (IC) originally having an Al backend design. The process comprising the steps of (1) receiving an Al backend design of the IC; (2) determining layer construction of the Al backend design; (3) constructing primitive layer construction of a Cu backend design of the IC according to the layer construction of the Al backend design; (4) matching metal resistances of the Cu backend design with metal resistances of the Al backend design; (5) matching intra-metal capacitances of the Cu backend design with intra-metal capacitances of the Al backend design; (6) matching inter-metal capacitance of the Cu backend design with inter-metal capacitances of the Al backend design; (7) verifying the Cu backend design with a layout rule check tool to identify a violation; (8) fixing the violation identified if there is any; (9) generating final layout of the Cu backend design; and (10) fabricating the IC based on the Cu backend design using Cu BEOL fabrication process.

Other features and advantages of the invention will become more readily understandable from the following detailed description and figures.

BRIEF DESCRIPTION OF THE FIGURES

The invention will be described in detail along with the following figures, in which like parts are denoted with like reference numerals or letters.

DETAILED DESCRIPTION OF THE INVENTION

Disclosed below are representative embodiments of a method for using a Cu BEOL fabrication process to fabricate an integrated circuit (IC) originally having an Al backend design. The representative embodiments are disclosed herein for purposes of illustrating. The disclosed systems and methods should not be construed as limiting in any way. Instead, the present disclosure is directed toward all novel and nonobvious features and aspects of the various disclosed embodiments, alone and in various combinations and subcombinations with one another. Therefore, these and other variations upon the specific embodiments are intended to be covered by the present inventions. The systems and methods are not limited to any specific aspect or feature or combinations thereof, nor to the disclosed systems and methods require that any one or more specific advantages be present or problems be solved.

In the present disclosure, the terms "BEOL fabrication process," "BEOL process," "backend fabrication process," "backend process," and "backend technology" are used interchangeably.

In accordance with the present invention, it is envisioned that a Cu BEOL fabrication process is used to fabricate an integrated circuit (IC) originally having an Al backend design. The method does not require that the IC be redesigned for Cu backend process, or that the design be fabricated using an Al backend process. The method is based on a realization by the inventors that following a systematic methodology as described herein, an Al backend design can be converted to a Cu backend design without redesigning the IC for Cu BEOL fabrication process. The methodology of the present invention ensures that the functional and performance aspects of the existing circuit design related to interconnect layout are maintained by the replacement of Al interconnects with Cu interconnects. These aspects include parameters such as inter-metal or intra-metal capacitors, and metal line resistors which may affect circuit timing performances. In some embodiments, the methodology of the present invention also ensures that the existing Al interconnect layout design is converted to satisfy Cu process design rules including systematic dummy or slotting metal pattern replacements.

Figure 1:
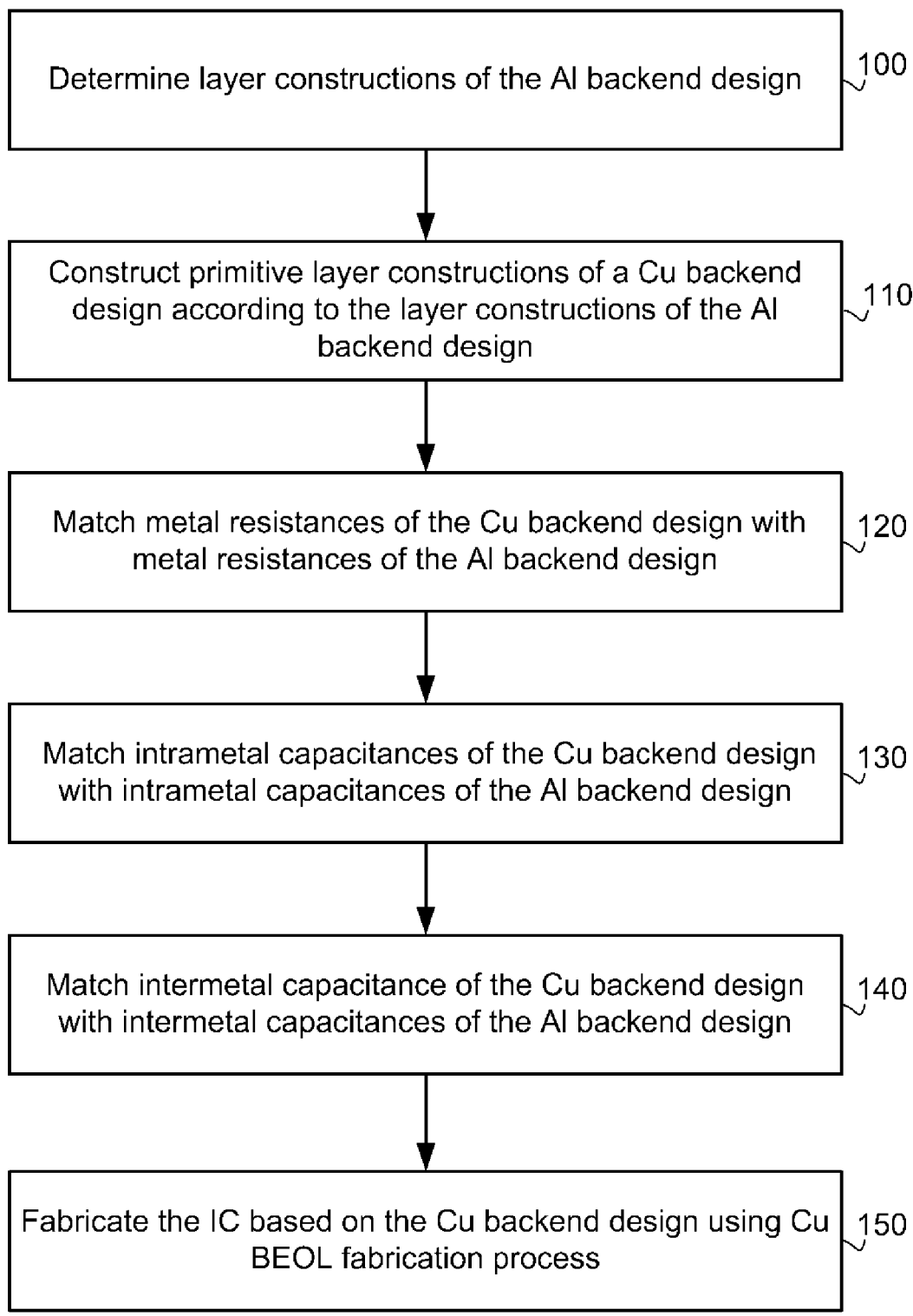
FIG. 1 is a block diagram showing an outline of several major steps of the method in accordance with the present invention.

FIG. 1 is a block diagram showing an outline of several major steps of the method in accordance with the present invention. As shown in FIG. 1, the method of using a Cu BEOL fabrication process to fabricate an integrated circuit (IC) originally having an Al backend design includes the following major steps:

At step 100 as shown in FIG. 1, the method obtains or determines layer construction of the Al backend design.

At step 110, the method constructs primitive layer construction of a Cu backend design according to the layer construction of the Al backend design.

At step 120, the method matches metal resistances of the Cu backend design with metal resistances of the Al backend design.

step 130, the method matches intra-metal capacitances of the Cu backend design with intra-metal capacitances of the Al backend design.

At step 140, the method matches inter-metal capacitance of the Cu backend design with inter-metal capacitances of the Al backend design.

At step 150, upon the conversion, the method fabricates the IC based on the Cu backend design using Cu BEOL fabrication process.

In other embodiments, additional steps may be taken to convert the Al backend design to the Cu backend design. In one embodiment, for example, converting the Al design to the Cu design further includes the following steps:

(a) generating layout of the Cu design;
(b) checking the layout with a Design-Rule Checking (DRC) tool;
(c) placing model/rule-based Optical Proximity Correction (OPC); and
(d) verifying mask layer generation.

The above steps, including both the major steps and the additional steps, are described in further detail below.

1. Obtaining/Determining Layer Construction of the Al Backend Design

In the present invention, the term "design" or "circuit design" refers to a technical representation of a certain semiconductor product. Typically, the design (the technical representation) is a data file or a set of data files provided by the design company or the product company to a semiconductor manufacturing company (chipmaker) for fabrication of the product. The technical representation of the product can be of various forms. In one exemplary form, the technical representation has compiled data on the layer construction parameters such as metal thicknesses, thicknesses of inter-layer dielectric layers (ILD), thicknesses of inter-metal dielectric layers (IMD) and dielectric constant of each dielectric material (ILD or IMD). In a more common form, however, the technical representation is a set of CAD files containing systematic design information for fabrication. As known in the art, from the CAD files, data of multiple cross-section regions of the semiconductor product can be captured and extracted using appropriate software. Such data include the material properties of conductors and dielectrics within each cross section. The data of each cross section is assigned using object definitions. An object definition typically includes the type of material, naming rule, plating, dielectric type, and conductor type (signal or ground). The data is assigned using object definitions to represent cross-section profiles of the design product and may be used for profile modeling using simulation software such as SPICE. For a given technology, for example, SPICE model can accommodate a set of typical circuit design parameters (e.g., design parameters for CMOS) and a simple analytical approach for interconnect capacitance and inductance. SPICE model is also capable to cover a wide range of process parameter variations. For 2D simulation for interconnects, cross-section profiles with well-defined dielectric stack, dielectric constant, metal thickness and other vertical dimension can be used to predict capacitance, resistance and RC delay.

The above provides basic information for matching a Cu backend design with an Al backend design and to determine the boundaries of the process.

2. Constructing Primitive Layer Construction of a Cu Backend Design According to the Layer Construction of the Al Backend Design The layer construction of the Al backend design forms a basis and a rough starting point for a converted Cu backend design in accordance with the present invention. Regardless of which metal backend technology is used for manufacturing a circuit design, the final product is expected to have common or resembling features in its metal interconnect layer construction.

Figure 2:
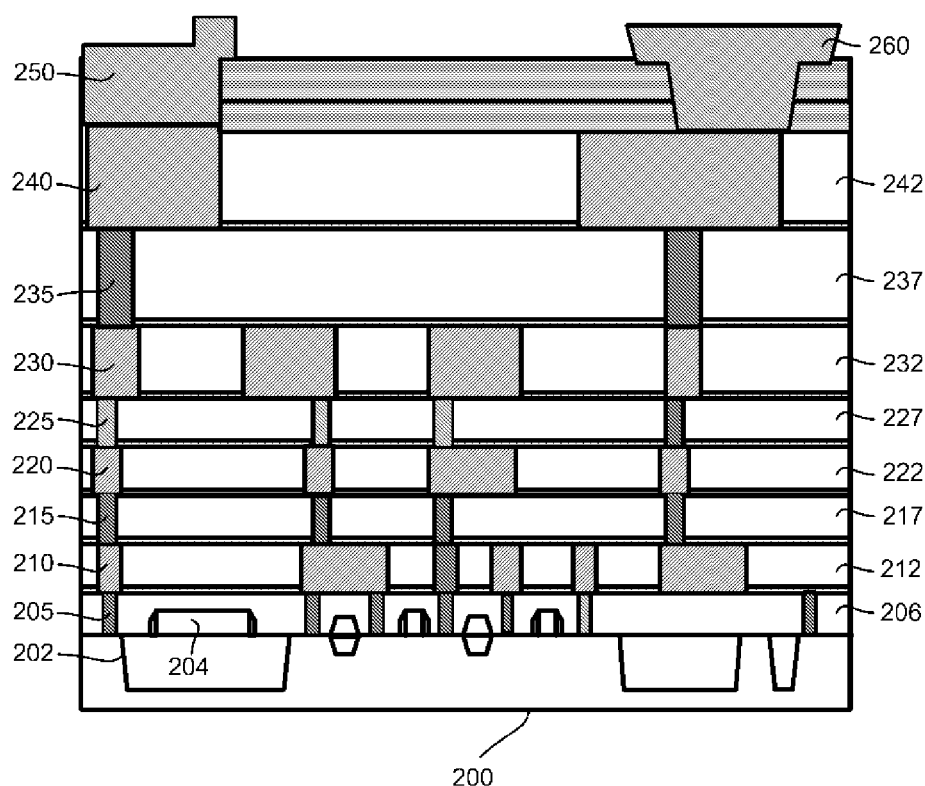
FIG. 2 is a schematic cross-sectional view of an interconnect metallization architecture representative of both Cu (generated by either dual or single damascene process) and Al interconnect metallization architectures on top of poly/contact substrate.

FIG. 2 is a schematic cross-sectional view of an interconnect metallization architecture representative of both Cu (generated by either dual or single damascene process) and Al interconnect metallization architectures on top of poly/contact substrate. The interconnect metallization architecture in FIG. 2 shows semiconductor substrate 200, shallow trench isolation (STI) region 202 and polysilicon gate (POLY) 204 in its lower portion representing the poly/contact substrate. On top of the poly/contact substrate is a multilayer interconnect metallization structure including lower vias/contacts 205, vias 215 (via1), 225 (via2) and 235 (viaT), metal interconnects 210 (MT1), 220 (MT2), 230 (MT3) and 240 (MT), and dielectric layers 206 (ILD0), 212 (IMD1), 217 (ILD1), 222 (IMD2), 227 (ILD2), 232 (IMD3), 237 (ILDT) and 242 (IMDT). On top of the multilayer interconnect metallization structure is a passivation layer including wire bond 250, metal bump 260 (as used in flip chip packaging). The interconnect metallization architecture shown in FIG. 2 is a multi-level metal interconnect showing four levels of metal, Metal 1 (MT1 210), Metal 2 (MT2 220), Metal 3 (MT3 230) and Top Metal (240). An actual modern interconnect metallization architecture may have even more (six or more) metal levels. In a multi-level metal interconnect, alternating levels run orthogonal to the levels above and below to minimize inter-level interference. In the lower local interconnect layers, the wires are only used within a cell or block where the finest metal pitch design is employed. In the upper global interconnects, where the lines are designed to be long, thick and wide, the metal interconnects are used for inter-block communication. In deep submicron design, intermediate layers are adopted to redistribute densely packed wires (metal interconnects). At the top are I/O outputs passivated through either Al wire bonds (e.g., wire bond 250) or solder balls (e.g., metal bump 260).

In each layer, metals or vias are deposited in one or more dielectrics. In the present disclosure, dielectrics between two adjacent metal levels are referred to as inter-layer dielectrics (ILD), while dielectrics embedding a metal interconnect layer are referred to as intra-metal dielectrics (IMD). As shown in FIG. 2, dielectric layers 217, 227, and 237 are ILD layers, while dielectric layers 212, 222, 232 and 242 are IMD layers. The lowest level dielectric 206 is somewhat special because it embeds a via/contact layer 205 which itself may consist of two sublayers (not shown) with a top sublayer serving as via connecting to Metal 1 (210) and a bottom sublayer serving as local interconnects.

Because the layer construction of both the Al backend design and the Cu backend design are expected to have common or resembling features in its metal interconnect layer construction, the layer construction of the Al backend design forms a basis and a rough starting point for a converted Cu backend design in accordance with the present invention. Once the layer construction of an existing Al backend design is determined, primitive layer construction of a Cu backend design are set forth according to the layer construction of the Al backend design.

The primitive layer construction of the Cu backend design, however, is generally inadequate to be used as a final design for Cu backend fabrication. According to some embodiments of the present invention described below, before taking an existing Al design for Cu interconnect process, several additional steps are carried out to match up the original design and manufacturing requirements.

3. Matching Metal Resistances of the Cu Backend Design with Metal Resistances of the Al Backend Design As recognized above, simply taking the layer construction of the original Al backend design to be the primitive layer construction of the Cu backend design may result in inconsistency of electrical characteristics, such as conductors/resistors and capacitors, between the Cu backend design and the Al backend design. This is because there are generally differences in process architecture and the electrical properties of the materials such as metal resistivity and effective dielectric constants of the dielectric layers. In accordance with the present invention, several parameters of the layer construction can be adjusted to match up the electrical characteristics.

One parameter that can be adjusted to match the electrical characteristics of Cu design and Al design is the line resistance of metal line resistors.

Figure 3:
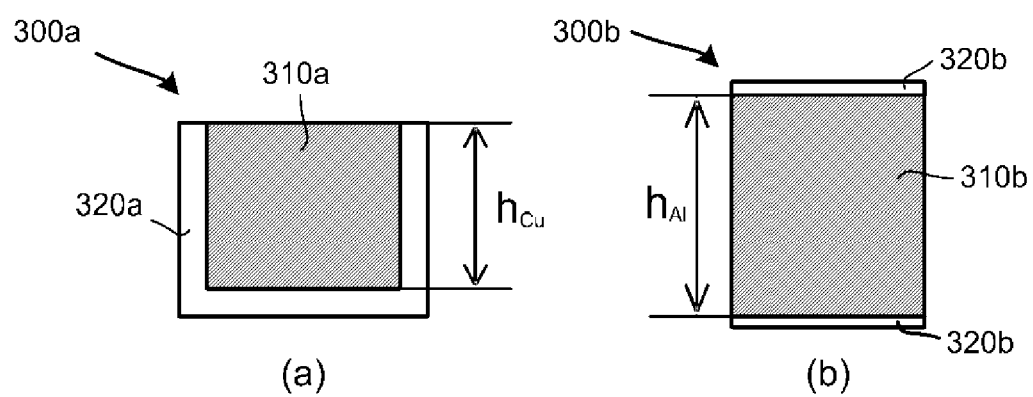
FIG. 3 shows cross-sections of a Cu line resistor and an Al line resister with barrier layers or coatings.

FIG. 3 shows cross-sections of a Cu structure 300a and an Al structure 300b with barrier layers or coatings. Cu line 310a is generally electroplated and is surrounded be barrier layer 320a, while Al line 310b is generally an Al (Cu) alloy deposited by PVD and is sandwiched by contact layers 320b. The resistance of Cu structure 300a is contributed by Cu line 310a itself and barrier layer 320a surrounding the Cu line 310a. Barrier layer 320a is generally a high conductivity (lower resistivity) material such as Ti, Ta, TiN, TaN, TaSiN, TiTa, TiW, WN or other refractory metals and their compounds or alloys. Similarly, the resistance of Al structure 300b is contributed by Al line 310b itself and contact layers 320b sandwiching the Al line 310b. Contact layers 320b are generally made of a conductive material such as Ti, Ta, TiN, TaN, TaSiN, TiTa, TiW, WN or other refractory metals and their compounds or alloys. The resistivity of the conductive materials is usually restricted by the choice of materials based on the design and the selected fabrication process.

Matching the resistance of Cu structure 300a and Al structure 300b may be accomplished by scaling the cross-section of Cu line 310a, the cross-section of barrier layer 320a, or both. Preferably, however, resistance matching is accomplished by scaling the cross-section of Cu line 310a alone. This is because the thickness of barrier layer 320a tends to be restricted by the fabrication process, or even if it is not restricted would only have a relatively small range of adjustment in any event. Furthermore, although in principle the cross-section of Cu line 310a may be scaled by changing either the height $h_{Cu}$ (thickness) of the Cu line or the width of the Cu line, the former (changing $h_{Cu}$) is preferred because changing the thickness of the Cu line is more straightforward and easier to manage from a manufacturing point of view. In contrast, changing the width of the Cu line will also affect the dimensions of intra-metal dielectrics (IMD) and thus intra-metal capacitances, further complicating the process.

Accordingly, in one exemplary embodiment, metal resistance of the Cu backend design is matched with metal resistances of the Al backend design by simply scaling the thickness (height $h_{Cu}$) of the Cu line 310a. The scaling can be performed by simply determining the copper thickness corresponding to an Al thickness based on comparing Cu resistivity with Al resistivity. The resistivity of Cu is about 30% lower than that of Al alloy (with 2% Cu). Taking into account the total metal cross section area including higher resistivity Ta/TaN barrier layers surrounding the Cu, scaling Cu metal thickness (height) down by 20% of the corresponding Al thickness would match metal line resistance within (+/−) 10% of the original design target without requiring modifying the original layout design for Al backend process.

The above simple and straight estimation of resistance based on material resistivity and the dimensions of the resistors may be sufficiently accurate for many applications. However, if higher accuracy is required, the scaling of the Cu line dimensions (such as the thickness as discussed above) may be further refined using modeling techniques. For example, upon a rough scaling, the resultant layer construction of an interim Cu backend design may be taken as a starting point for a round of SPICE simulation which generally would lead to more accurate estimations of electric characteristics including line resistances of the interim Cu backend design. The results of the SPICE simulation are then used as guidance for further refined scaling. The process may be reiterated until a satisfactory result is obtained.

4. Matching Intra-Metal Capacitances of the Cu Backend Design with Intra-Metal Capacitances of the Al Backend Design Another parameter that can be adjusted to match the electrical characteristics of Cu design and Al design is the intra-metal capacitances. As shown below, in one embodiment matching intra-metal capacitances of the Al design with intra-metal capacitances of the corresponding Cu design may be accomplished by tuning an effective dielectric constant of intra-metal dielectric layers.

Figure 4:
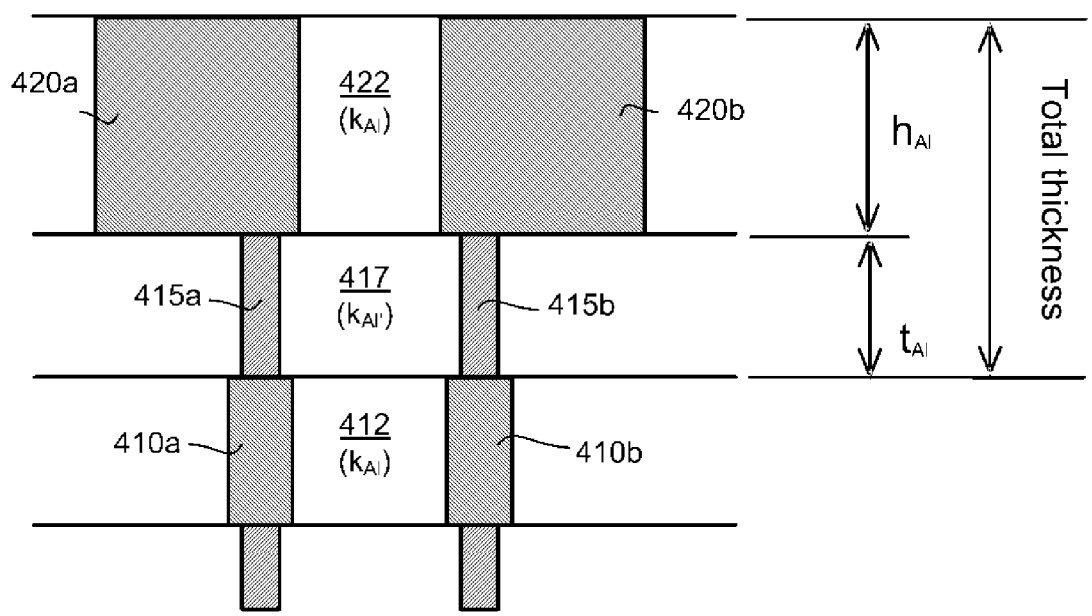
FIGS. 4-5 are schematic cross-sectional views of a small section of an exemplary layer construction of an Al backend design and the layer construction of a corresponding Cu backend design, showing intra-metal capacitances.
Figure 5:
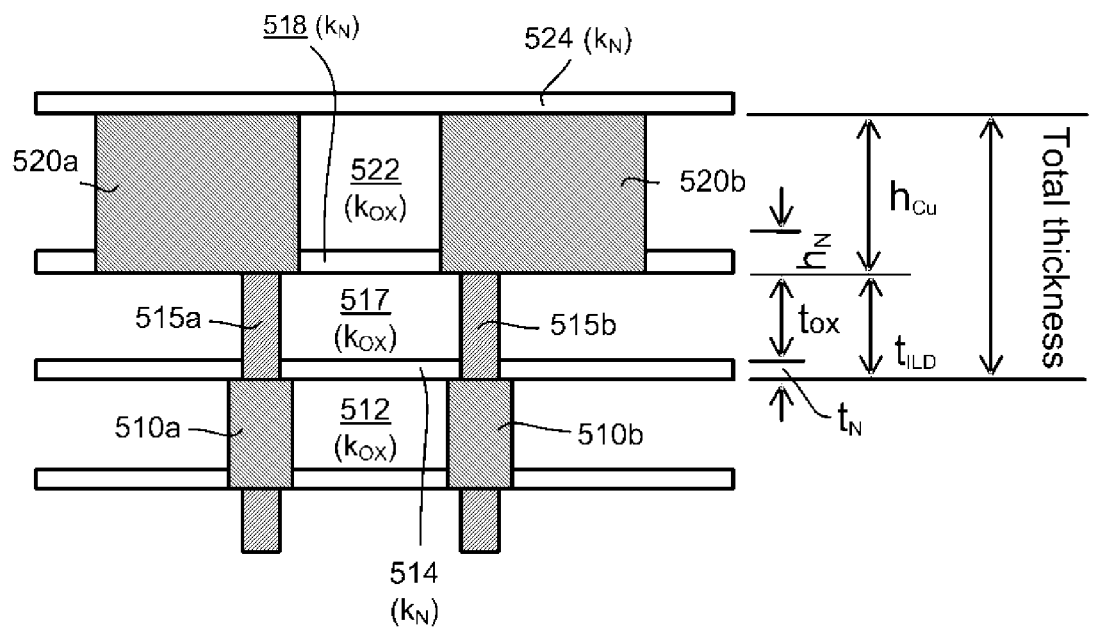

FIGS. 4-5 are schematic cross-sectional views of a small section of an exemplary layer construction of an Al backend design and the corresponding layer construction of a Cu backend design, showing intra-metal capacitances. FIG. 4 shows the Al layer construction having Al interconnects 410a/410b embedded in intra-metal dielectric layer (IMD) 412 (usually an oxide layer such as a silicon oxide), and vias 415a/415b (usually a W plug) passing through inter-layer dielectric layer (ILD) 417 and connecting to next level Al interconnects 420a/420b embedded in intra-metal dielectric layer (IMD) 422.

FIG. 5 shows the corresponding Cu layer construction having Cu interconnects 510a/510b embedded in intra-metal dielectric layer (IMD) 512 (usually an oxide layer such as a silicon oxide), cap layer 514 (usually a nitride), and vias 515a/515b passing through inter-layer dielectric layer (ILD) 517 and connecting to next level Cu interconnects 520a/520b embedded in intra-metal dielectric layer (IMD) 522. FIG. 5 also shows etch-stop layer 518 (usually a nitride such as $Si_xN_y$) and cap layer 524.

Intra-metal capacitance is the capacitance between two neighboring metal interconnects at the same metal level, for example that between the two neighboring metal interconnects 420a and 420b in the Al backend design (FIG. 4), and that between the two neighboring metal interconnects 520a and 520b in the corresponding Cu backend design (FIG. 5). A metal-to-metal capacitance is determined by the following factors:

(a) shape and area of the metal lines;

(b) space between the metal lines; and (c) effective dielectric constant k of the insulating layer(s) between metal lines.

In the example shown in FIGS. 4-5, upon matching the metal line resistance by using the method described above, the intra-metal capacitances (such as that between Cu interconnects 520a and 520b) become smaller due to reduction of metal cross section (area of metal platting). One way to match the capacitance to the original design is to increase the total effective dielectric constant between the two neighboring metal interconnects (e.g., Cu interconnects 520a and 520b in FIG. 5). This may be accomplished in a variety of ways including selecting a material of higher dielectric constant k or introducing an extra dielectric layer has discussed below.

In one embodiment, the effective dielectric constant $k_{Cu}$ of Cu intra-metal dielectric is increased by inserting (for a Cu process requiring no etch-stop layer) or optimizing the thickness (for a Cu process already requiring an etch-stop layer) of a nitride layer, such as etch-stop layer 518. Nitride layers usually have high dielectric constant k. For example, SiN has a higher k value of around 7.8, nearly 2 times higher than that of fluorosilicate glass (FSG) dielectric. As a result, the total (or effective) dielectric constant of the combined dielectric layer structure between intra-metals (e.g., 520a and 520b) is increased and thus compensates the loss of capacitance caused by reducing metal platting areas to mach up with the existing Al design. The nitride layer thickness needed for a proper amount of compensation can be determined as follows:

Referring to FIGS. 4-5, to match the intra-metal capacitances $C_{Cu}$ between Cu interconnects 520a and 520b and $C_{Al}$ between Al interconnects 420a and 420b (i.e., $C_{Cu}=C_{Al}$), one needs $k_{Cu}h_{Cu}=k_{Al}h_{Al}$, where $k_{Cu}=(k_{Ox}(h_{Cu}-h_N)+k_Nh_N)/h_{Cu}$.

Therefore, $((k_{Ox}(h_{Cu}-h_N)+k_Nh_N)/h_{Cu}) \times h_{Cu}=k_{Al}h_{Al}$.

From the above equation one can solve for $h_N$:

$h_N=(h_{Al}k_{Al}-h_{Cu}k_{Ox})/(k_N-k_{Ox})$, where $h_N$ is the thickness of the nitride etch-stop layer 518, $h_{Cu}$ is the Cu metal height determined by matching resistances of line resistor as described above, $h_{Al}$ is the original Al metal (420a/420b) height, $k_{Cu}$ the effective dielectric constant of Cu intra-metal dielectric, $k_N$ is the dielectric constant of nitride etch-stop layer 518, $k_{Ox}$ is the dielectric constant of oxide dielectric layer 522 of Cu architecture, and $k_{Al}$ is the effective dielectric constant of intra-metal dielectric layer 422 of Al architecture.

For example, with an original Al thickness of 3500 Å, FSG dielectric constant (assuming the same for both $k_{Al}$ and $k_{Ox}$) of 3.6, a nitride dielectric constant of 7.8, and Cu thickness $h_{Cu}$ scaled down by 20% to 2800 Å, a nitride etch-stop layer 518 of a thickness $h_N$ of 600 Å can be used with an upper FSG dielectric layer (522) of 2200 Å thickness ($h_{Cu}-h_N$) to provide matched intra-metal capacitance in the Cu design.

Slightly different considerations need to be given depending on the actual Cu backend process is used for fabrication of the IC. As discussed in further detail in a later section of this description, Cu process may use a variety of process schemes, including single damascene process, via-first dual damascene process with a trench etch-stop layer, trench-first dual damascene process with an etch-stop layer, and trench-first dual damascene process with no etch-stop layer. For a Cu process that inherently includes a nitride layer (such as an etch-stop layer), the thickness of the inherent nitride layer is adjusted according to the above discussions in order to match the intra-metal capacitances. For a Cu process that in itself does not require a nitride layer as an etch-stop layer, a nitride layer having a proper thickness is inserted for the purpose of matching the intra-metal capacitances as discussed above.

To allow the nitride layer (e.g., 518 in FIG. 5) to fully contribute to intra-metal dielectric (IMD) insulation, the portions of the nitride layer under the metal pattern (e.g., portions corresponding to the bottom of Cu interconnects 520a and 520b) should desirably be removed by, for example, a wet etching process with high nitride-to-oxide selectivity.

5. Matching Inter-Metal Capacitance of the Cu Backend Design with Inter-Metal Capacitances of the Al Backend Design Another parameter that can be adjusted to match the electrical characteristics of Cu design and Al design is the inter-metal capacitances. As shown below, in one embodiment matching inter-metal capacitances of the Al design with inter-metal capacitances of the corresponding Cu design may be accomplished by tuning an effective dielectric constant of inter-metal dielectric layers.

Still referring to FIGS. 4-5, the matching of inter-metal capacitance is illustrated using the capacitance between Cu interconnects 510 (510a and 510b) and the upper Cu interconnects 520 (520a and 520b). Assuming no change in the active metal layout, the only consideration to match the capacitance is the effective k value (dielectric constant) and the total thickness of the combined inter-layer dielectric (ILD) including inter-layer dielectric (ILD) 517 and cap layer 514. Thus inter-layer metal capacitance can be simply managed by adjusting the ILD thickness as follows:

$$t_{ILD} \times k_{Al'} = t_{Al} \times k_{Cu'},$$

therefore, $$t_{ILD} = t_{Al}(k_{Cu'}/k_{Al'}),$$

where $k_{Al'}$ is the effective k value of the inter-layer dielectric 417 in the original Al design, which may either be a single material layer or a combined layer of more than one material, $k_{Cu'}$ is the effective k value of the combined inter-layer dielectric layer including inter-layer dielectric (ILD) 517 and nitride cap layer 514 in the Cu design.

In an exemplary case where the Cu process contains a combined inter-layer dielectric layer including two dielectric layers as shown (517 and 514), the effective k value $k_{Cu'}$ of the combined inter-layer dielectric layer can be defined as:

$$k_{Cu'} = (k_N \times t_N + k_{Ox} \times t_{Ox})/t_{ILD},$$

where $t_N$ is the thickness of nitride cap layer 514, which is generally determined by the particular Cu process to be used for fabricating the IC, and the total ILD thickness $t_{ILD}$, the sum of oxide thickness $t_{Ox}$ and the nitride layer thickness $t_N$, is determined by $t_{ILD} = t_{Ox} + t_N$.

With the above relations, the metal height $h_{Cu}$ (which includes the nitride etch-stop layer thickness $h_N$), and the ILD thickness $t_{ILD}$ (which includes the nitride cap layer thickness $t_N$) may be determined or estimated. The total dielectric layer thickness deposited can also be determined as the sum of the metal height $h_{Cu}$ and the ILD thickness $t_{ILD}$. These results are used to further refine the primitive or an interim layer construction of the Cu design.

With the above described adjustments on the primitive layer construction of the Cu design, an improved Cu design is obtained. The improved Cu design may be then used for fabricating the Cu metallization structures for the IC which originally had an Al design. As discussed below, additional steps may be taken to further improve the Cu design. Exemplary processes to form such Cu metallization structures are also described in a later section of the present description.

For simplicity, only one IMD and one ILD related to exemplary metal layers are discussed. But the same principle may be applied to other IMDs and ILDs in the layer constructions of the Al design and the Cu design. In addition, although the above discussions assumed, for simplicity, that all oxide layers in the Cu design and the Al design have the same dielectric constant and all nitride layers in the Cu design also have the same dielectric constant, such condition is not required. One who is skilled in the art will readily appreciate that the same principle as discussed above may be applied to various layers with different dielectric constants.

6. Design Rule Check (DRC) and Correction

Cu process has its unique layout rules for process robustness which may not be met by the existing Al layout, such as minimum metal density, maximum line width and via rules. In addition to matching resistances and capacitances as described above, some embodiments of the present invention also provide a systematic approach and methods to fulfill the process rule-related requirements.

Specifically, the following aspects of the design are checked and corrected if possible to establish a more robust Cu process. Generally, however, it is desirable to accommodate the original design dimensions to the maximum feasible extent, unless without corrections process problems may be encountered.

a) Nominal Sizes and Spaces of Metals and Vias

With a Cu design obtained from the original Al design as described above, a further step may be taken to verify metal size and space, via size and space with corresponding Cu rules. The original design dimensions are preferably accommodated to the maximum extent unless process problems may be encountered without proper corrections. Metal and via resizing potentially could cause serious performance problems or even functional problems and therefore should be assessed carefully under guidance from original designer of the Al design. In one preferred embodiment, no change is done on the total length of metal.

When at least one metal is wider than a threshold width (e.g., 5× of the nominal size), the space between the metal lines needs to be enlarged. With enlarged space between the metal lines, the scaling of the process characteristics needs to be done accordingly in patterning (e.g., photoresist patterning in dual damascene process as described below) and Chemical Mechanical Planarization (CMP).

b) Minimum Via/Metal Enclosure and Metal/Via Overlay

Figure 6:
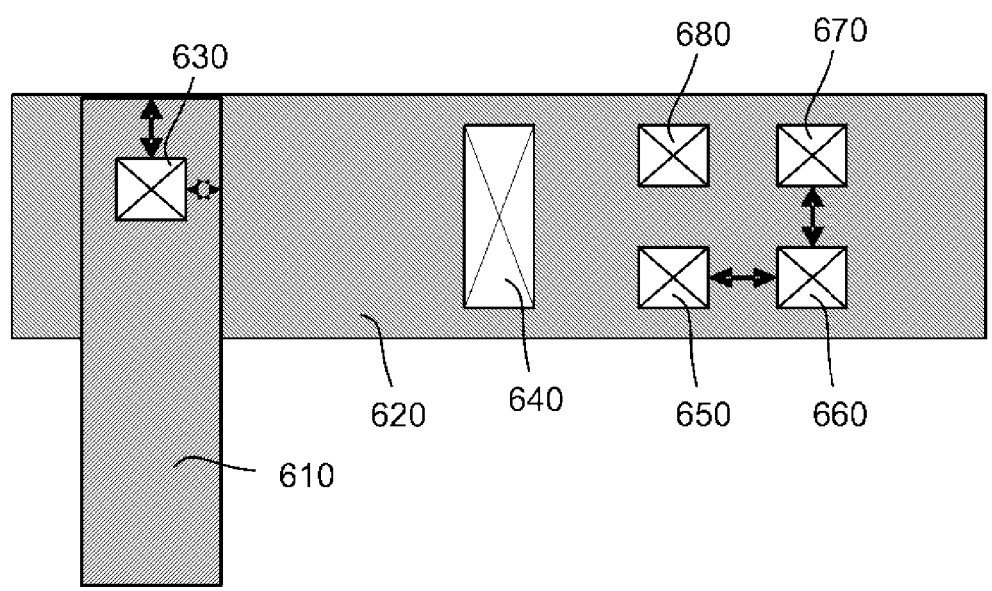
FIG. 6 shows an example of some via/metal enclosures and via/metal overlays in a Cu interconnect architecture.

FIG. 6 shows an example of some via/metal enclosures and via/metal overlays in a Cu interconnect architect. The example includes Cu interconnects 610 and 620, and square single via 630, rectangular single via 640, and via array 650, 660, 670 and 680. Cu backend processes generally require a minimum via/metal enclosure and metal/via overlay for via and metal connection as indicated by the arrows in FIG. 6. Some Cu backend processes may require more than one via (e.g., via array 650, 660, 670 and 680) to connect upper and lower metal lines if either metal line is wide. In some Cu backend processes, rectangle vias (e.g., via 640) are allowed as long as the vias are sized properly according to bias buildup during patterning process.

c) Maximum Metal Width and Density Rules

In some Cu processes, the design may need to comply with requirements of a maximum width (e.g. 15 μm) and a maximum metal density (e.g. 75% in 100×100 stepping window, or 85% in 300×300 stepping window). In case of such violations by wide metal lines, reduction of metal width and metal density may be necessary. This may be accomplished by adjusting Cu thickness, slotting, or a combination thereof. Slotting is generally more preferred than metal thickness control to reduce metal width and metal density.

Because Cu processes cover process generations finer than Al processes, there is generally no stringent constraint on minimum metal width in Cu processes. However, such constrains, if there are any, may also be satisfied using similar methods.

Figure 7:
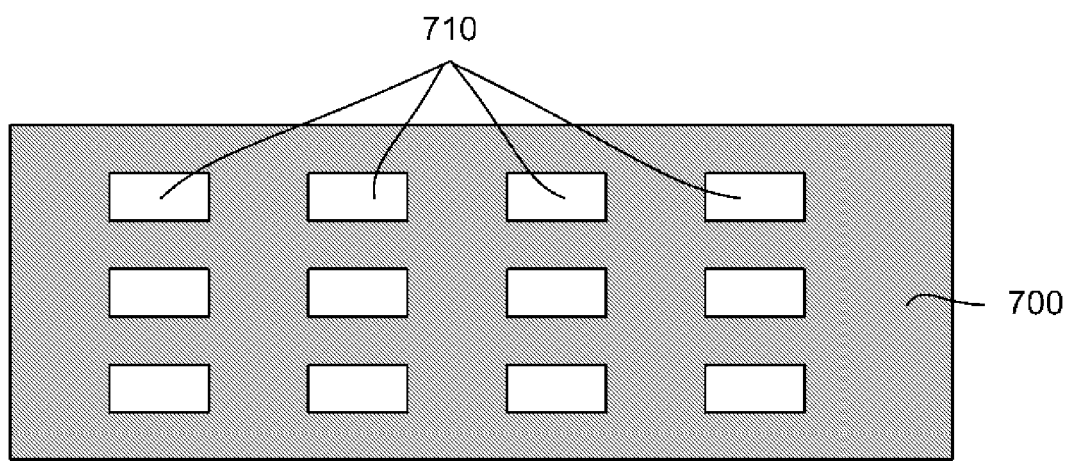
FIG. 7 shows an example of slotting.

FIG. 7 shows an example of slotting. Multiple slots (openings) 710 are made on wide Cu interconnect 700 to reduce the overall metal density of wide Cu interconnect 700. Topical slot sizes and exclusion distances are defined for each circuit design generation. However, any rule of slotting may be used if there is a special condition requiring a change.

d) Minimum Metal Density and Dumification

Some Cu processes have minimum metal pattern density rules to avoid poor metal etching control and to afford CMP metal thickness control at all metal levels. With such rules, the total metal coverage at each metal level on a chip needs to have at least the minimum metal pattern density for Cu process. One way to increase metal density to meet the minimum metal density requirement is using dumification in which the mask operation fills an open space by inserting dummy metal patterns if necessary (e.g. 20% in a 100×100 stepping window or 10% in a 300×300 stepping window).

Figure 8:
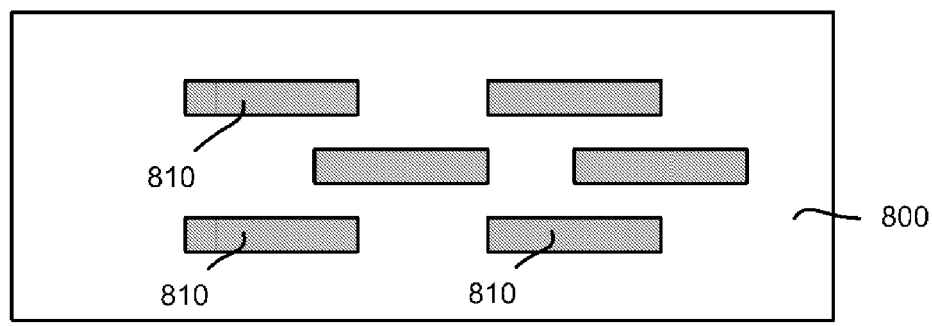
FIG. 8 shows an example of dumification.

FIG. 8 shows an example of dumification. Cu dummies 810 are inserted in wide empty space 800 to increase the metal density. Cu dummies 810 may be made using an automatic fill algorithm during layout design. In actual fabrication, dummies may be introduced by a fill algorithm during mask making. The chip preferably should be compliant to all metal density rules before delivery to the mask shop. For example, some Cu processes may require that metal dummy be floating and not grounded, or that metal dummy be placed in the direction of current flow.

7. Optical Proximity Correction (OPC) Procedure

In addition to the above described procedures for further refining the Cu design converted from the original Al design, OPC (Optical Proximity Correction) may also be applied to the verified layout data prior to mask making. OPC shapes are intended to maximize pattern fidelity and resolution during wafer processing.

OPC correction is atomically generated by model-based or rule-based algorithms to produce appropriate correction shapes for layouts, which need to comply with design rules. In accordance with the present invention, it is preferred that any non-compliant layout to receive custom OPC. These OPC shapes may be applied in parallel with dummy placement, and the resultant data files may be merged later. If there is in any of the data types a NO OPC ZONE by customer requirement, special data treatment may be required to prevent making shape corrections (such as creating an additional cover layer) that may breach the requirement during mask OPC processing. Protected layout may receive hand drawing or custom correction separately.

Model-based algorithms may be used to address complicated shapes and interaction with surrounding patterns. This may widen lithography process window. In lower levels of local interconnect, such as Metal 1 (M1) and Metal 2 (M2), narrow lines next to a wide big piece metal may need to be sized up to avoid pinch, if spacing allows such upsizing. A slightly wider line and narrower space may increase yield and give a wider coprocessor window and better depth of focus.

8. Other Considerations

In some applications, chip guard rings may be added to the Cu design. The chip guard ring generally needs to be a complete, unbroken ring around the entire active chip area intended to be guarded and serve as a continuous edge seal. The guard ring at all backend layers, especially via layers, should be rescaled according to the Cu process requirement. Usually, via level guard ring should be free from OPC treatment. The clearance distance of the guard ring and scribe line from the active die field are dependent on wire bond or bump assembly options, such as Controlled Collapse Chip Connection (C4) bump assembly. The Cu guard ring preferably should have no vertices except for the 90° angles which occur at corners.

9. Fabricating the IC Based on the Cu Backend Design Using Cu BEOL Fabrication Process When the Cu design is complete, it is then used in a Cu BEOL fabrication process to fabricate the IC. The method according to the present invention may be used for any type of Cu BEOL fabrication process. Because presently there is no practical method for etching Cu, the conventional subtractive processes as used in Al processes still cannot be used to form Cu interconnects. For this reason, Cu backend processes generally uses damascene schemes which does not require etching of Cu layers. Presently, several schemes, including a number of variations of single damascene scheme and dual damascene scheme, which are described below, may be used.

a) Single Damascene

Figure 9:
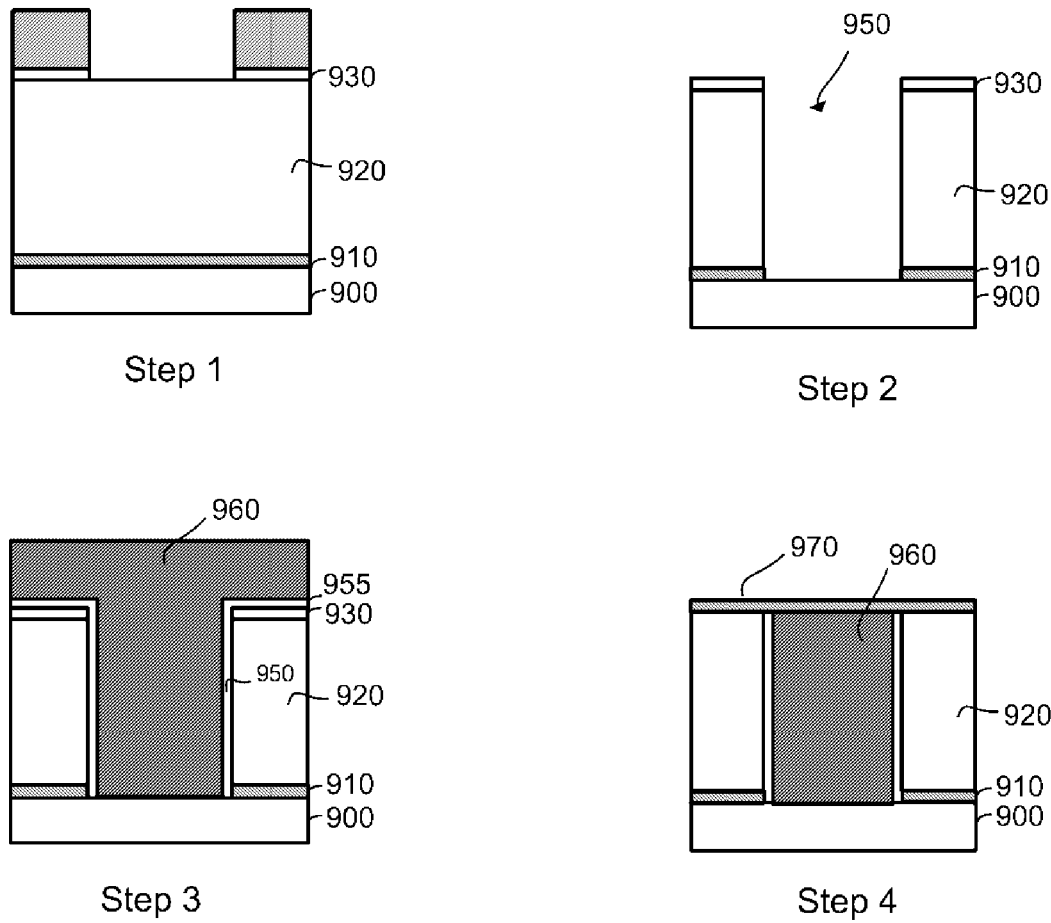
FIG. 9 shows an exemplary sequence of process steps used to create a single damascene interconnect structure.

FIG. 9 shows an exemplary sequence of process steps used to create a single damascene interconnect structure. Single damascene interconnect scheme is used for creating either a metal interconnect or a via, separately. The following description applies to either forming a metal interconnect or a via. For clarity, however, the process is described below as to form a via.

As shown in FIG. 9, at step 1, the etch-stop layer 910 (silicon nitride or silicon carbide for inorganic ILD), interlayer dielectric layer (ILD) 920 (oxide, fluorinated silicon oxide, or low-k dielectrics), and antireflective layer 930 (ARC—oxide nitride) are deposited sequentially. Photoresist 940 is deposited to pattern the vias (or trenches if the process is to form a metal interconnect).

At step 2, via space 950 (or trench if the process is to form a metal interconnect) is etched in the dielectrics. The etch-stop layer 910 is etched through in order to make conductive connection between the via (to be formed in via space 950) and the underlying layer 900, which may be a contact, a via or a metal interconnect depending on the structure. At step 3, a multi-layer barrier/seed film 955 is deposited by PVD into the via space 950 that has been etched out in dielectrics. The multi-layer barrier/seed film 955 may be a TaN/Ta, TiN/Ti, WN and other binary and tertiary films (amorphous film is preferred for better interface with the underlying FSG or oxide). The block Cu 960 is then deposited by electroplating (step 3). At step 4, the barrier-layer 955 and top Cu film of the block Cu 960 are removed by CMP from areas above the surface of the ILD 920, leaving the remaining barrier-layer and Cu 960 recessed in via/trench space 950. The entire wafer surface is then covered by deposited diffusion barrier layer 970 (silicon nitride or silicon carbide for inorganic ILD, or oxide for organic ILD) to completely encapsulate copper interconnects 960 (step 4). The barrier layer 970 may also be an etch-stop layer for the next layer (not shown).

In the most common Cu processes, Metal 1 is usually generated by single damascene process. Single damascene process is also utilized to fabricate very thick global interconnect layer which is initially designed for Al wires to carry high currents of the chip. Combined of metal and landing via, such Al wires may have an aspect ratio that is too high (e.g., >5) to make void free gap-fill. As a result, two single damascene processes are used to run via layer and metal layer separately. Single damascene is also the process to generate MIM inductors in a BEOL flow of RF devices.

b) Dual Damascene

Unlike single damascene, dual damascene scheme forms vias and trenches for metal interconnect simultaneously. There are a number of different dual damascene schemes known and used.

Figure 10:
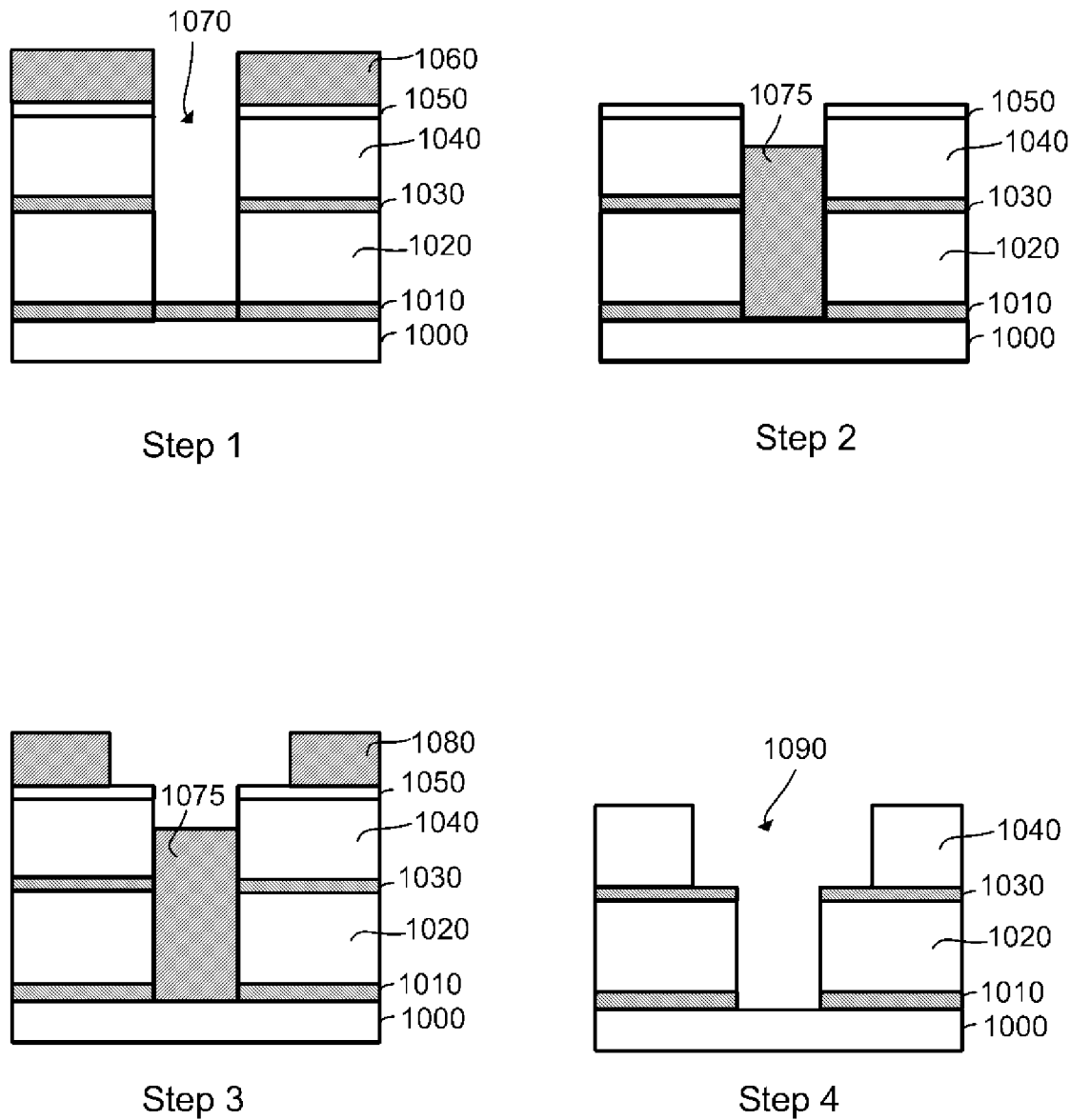
FIG. 10 shows an exemplary sequence of process steps used to create a dual damascene interconnect structure using the via-first process scheme with a trench etch-stop layer.

FIG. 10 shows an exemplary sequence of process steps used to create a dual damascene interconnect structure using the via-first process scheme with a trench etch-stop layer. As illustrated in FIG. 10, at step 1 of the via-first approach, dielectric cap layer 1010 (silicon nitride), ILD 1020, trench etch-stop layer 1030 (silicon nitride or silicon carbide for inorganic ILD, or oxide for organic ILDs), intra-metal dielectric (IMD) 1040 (oxide, fluorinated oxide, or inorganic/organic low k) and ARC 1050 are sequentially deposited on the polished metal 1000 of the previous level, followed by photo patterning using photoresist 1060 and etching to form the via space 1070 into the ILD 1020.

At step 2, following photoresist removal, a bottom anti-reflection coating (BARC) and/or photoresist 1075 are used to fill the via 1070. At step 3, photoresist 1080 is deposited on top of ARC 1050 to form trench etching pattern. At step 4, after photo exposure and developing, the subsequent trench etching is end-pointed at trench etch-stop layer 1030, which becomes the trench bottom. Cu is then deposited into trench 1090 and the via space under the trench 1090 to form via and trench simultaneously (not shown).

Dual damascene is generally more efficient because it forms the vias and the trenches simultaneously instead of separately as does a single damascene scheme. However, in the dual damascene scheme illustrated in FIG. 10, trench misalignment may cause unfilled partial via (micro-via) and dust poses potential reliability issues. For this reason, the dual damascene scheme as illustrated in FIG. 10 is less preferred unless ample alignment tolerance is provided in the initial design. As a substitute, the trench-first approach as illustrated below may be more appropriate.

Figure 11:
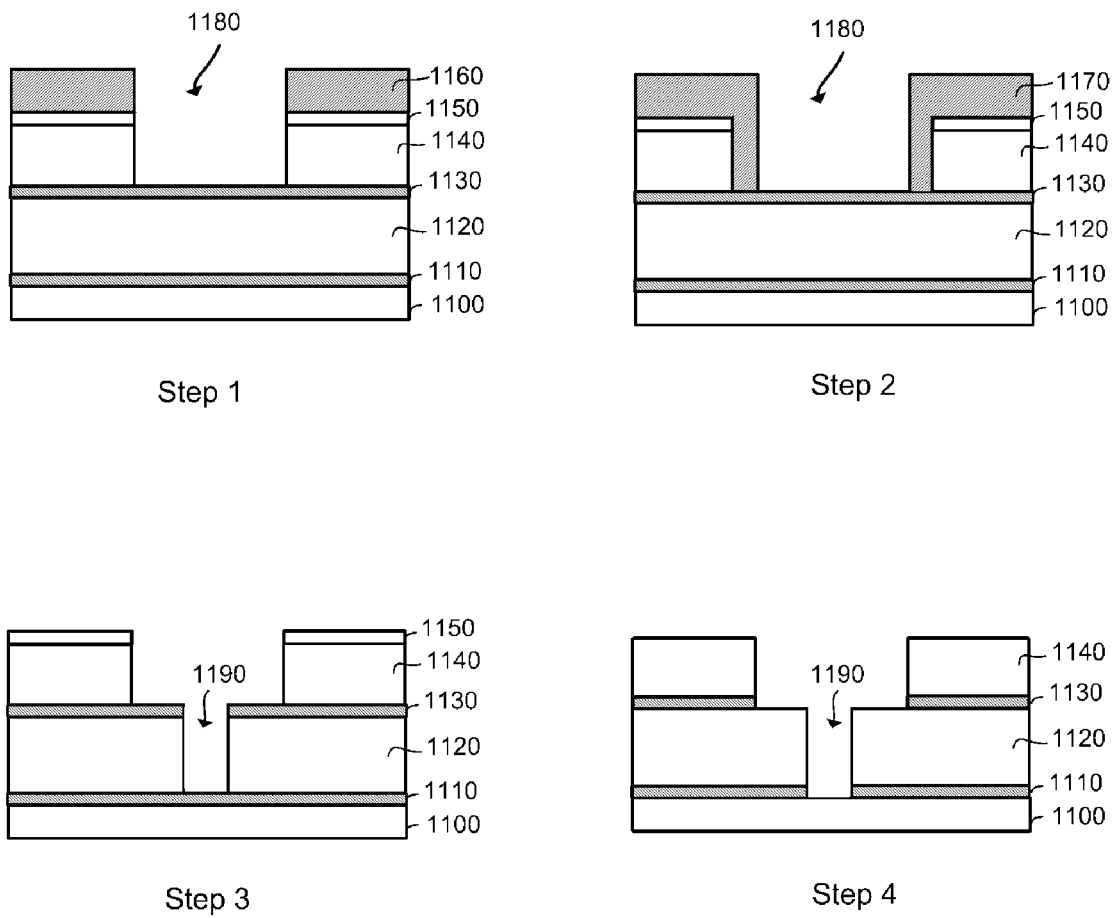
FIG. 11 shows an exemplary sequence of process steps used to create a dual damascene interconnect structure using the trench-first process scheme with a trench etch-stop layer.

FIG. 11 shows an exemplary sequence of process steps used to create a dual damascene interconnect structure using the trench-first process scheme with a trench etch-stop layer. FIG. 11 shows previous metal layer 1100, dielectric cap layer 1110 (e.g., silicon nitride), ILD 1120, metal etch stop layer 1130 (e.g., silicon nitride), IMD 1140, ARC 1150, photoresist 1160, trench opening 1180, photoresist 1170, and via opening 1190. In the trench-first approach, trench opening 1180 is formed first and via opening 1190 is patterned on the etched trench, which may present significant topography as shown in FIG. 11. This may help reduce trench/via alignment problems as compared to the via-first process scheme shown in FIG. 10. In case of misalignment, partial vias can be avoided by using sufficient over-etching to ensure that the full ILD/IMD thickness is cleared.

Figure 12:
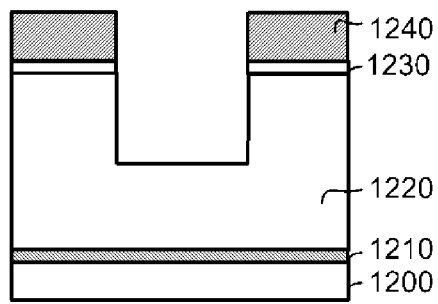
FIG. 12 shows an exemplary sequence of process steps used to create a dual damascene interconnect structure using the trench-first process scheme with no etch-stop layer.
Figure 12:
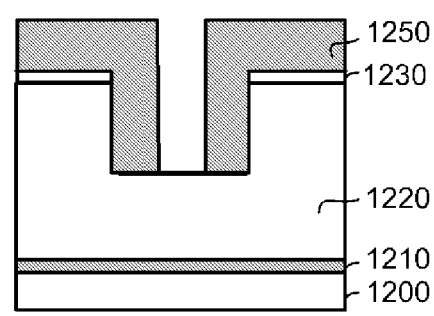
Figure 12:
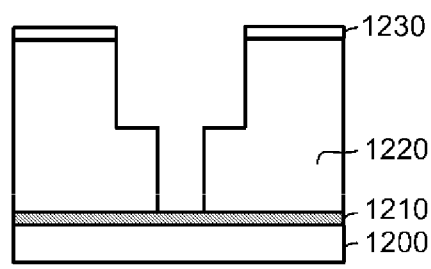
Figure 12:
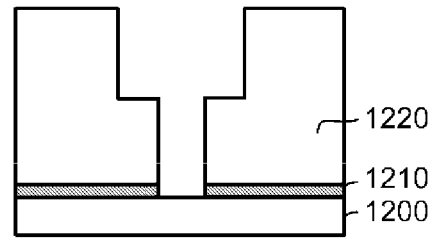

As will be illustrated in FIG. 12, the scheme shown in FIG. 11 may skip trench etch-stop layer 1130, and use timed etching to control initial trench depth. With this arrangement, some variations in depths with feature size or locations on the wafer may be expected. Insertion of an etch-stop layer 1130 beneath the trench improves trench depth control but leads to higher capacitance, since commonly used etch-stop materials (e.g., silicon nitride and silicon carbide) exhibit higher dielectric constant than typical oxide, FSG or low-k dielectrics.

FIG. 12 shows an exemplary sequence of process steps used to create a dual damascene interconnect structure using the trench-first process scheme with no etch-stop layer. FIG. 12 shows previous metal your 1200, dielectric cap layer 1210 (e.g., silicon nitride), ILD 1220, ARC 1230, photoresist 1240 (for trench etching), and photoresist 1250 (for via etching). In the dual damascene scheme shown in FIG. 12, no intervening trench etch-stop layer (such as etch-stop layer 1130 in FIG. 11) is used, and the ILD and IMD are deposited simultaneously. In fact, the same dielectric 1220 serves as both the ILD and IMD. This is the most cost-effective approach with the shortest process flow and the best cycle time, and thus a more desired approach in some applications. The dual damascene scheme shown in FIG. 12 may be used in either the via-first or the trench-first approach as illustrated in FIGS. 10-11.

In cases where a trench etch-stop layer is used (e.g., the scheme shown in FIG. 11), two different dielectric layers may be used (not counting etch-stop layers) for ILD and IMD, one with lower dielectric constant than the other. For example, the dielectric with the lower k may be used as IMD level, while the other placed at the via/ILD level. The low-k IMD approach is expected to see more applications as fragile low-k materials with reduced mechanical strength and thermal conductivity are becoming available.

The sufficient planarity within wafer and within die is critical to facilitate patterning of fine features of via holes or local interconnect wires. The rough topology (e.g., from 0.1 μm to 0.6 μm) would cause irregular metal line shapes or unopened vias if the step height or recess exceeds the tolerance range of the depth of focus. Like ILD planarization in Al subtractive BEOL process, CMP can be used immediately after ILD/IMD deposition to planarize dielectric surface topography inherited from underlying layers. Insertion of a CMP step, however, increases total cost of process, and therefore should be selectively used, for example, to facilitate lithography patterning on the upper global interconnect layers, where accumulative topography has been formed from multiple stack layers.

Since Cu does not form a self-passivation oxide layer as does aluminum, Al passivation bond pad structure is fabricated directly on planarized Cu wire, by depositing and patterning a multi-film passivation layer, which can be silicon nitride, oxide or oxide nitride. Subsequently, PVD depositing, patterning and etching alumina stud on the top of the passivation layer are used to form bond pad terminal over the underlying Cu wiring. A barrier layer (single or binary films such as TaN and Ta) is used to interface Cu wire and Al pad. As an option of chip end conditions, an organic passivation layer (photo sensitive polyimide or BCB) can be coated and patterned on the surface of the final stack as a buffer layer between the chip and package.

For the solder bump application (as needed for flip chip package), the commonly used under-barrier metallurgies (UBM) (in Al/W BEOL) may not be compatible with Cu metallization. New barrier composites are being developed for various bump solder materials from lead-containing solder material (e.g., $Pb_{63}Sn_{37}$, high lead $Pb_{95}Sn_5$, ultra-low alpha, etc.) to lead free materials (e.g., SnAg, SnCuAg, Sn, etc.) with the underlying copper.

The present invention provides a method enabling fabrication of an IC originally having an Al backend design using a Cu backend process without requiring either redesigning the IC based on Cu backend process or using an Al backend fabrication process. The method according to the present invention may be incorporated by a semiconductor chipmaker in a process for using Cu BEOL to fabricate an IC originally having an Al backend design. For example, the process may include the following steps:

(a) receiving an Al design for the IC;

(b) obtaining layer construction of the Al design;

(c) matching metal resistances of the Al design with metal resistances of a Cu design;

(d) matching intra-metal capacitances of the Al design with intra-metal capacitances of the Cu design;

(e) matching inter-metal capacitance of the Al design with inter-metal capacitances of the Cu design;

(f) verifying the Cu design with a layout rule check tool to identify a violation;

(g) fixing the violation identified if there is any;

(h) generating final layout of the Cu design; and (i) fabricating the IC based on the Cu design using Cu BEOL fabrication process.

In view of the current status of semiconductor manufacturing industry as described in the background, some embodiments of the present invention may bring several advantages including:

(a) equipment sharing and cost saving;

(b) flexibility of product mixing;

(c) limited additional product design effort; and (d) relatively fewer process steps than Al BEOL process and thus a more cost effective production structure.

Furthermore, improved electromigration resistance of copper allows higher current densities to be used in existing design, resulting in better reliability and performance than Al metallization.

This invention is particularly suitable to enable Cu BEOL process to manufacture IC devices previously designed for Al wire/W plug interconnect, such as most of the existing IC designs for 0.25 μm, 0.18 μm and 0.15 μm technologies.

This invention is applicable to a variety of Cu processes and integration schemes, including process options described herein and further listed in the following

TABLE 1

Types of Copper Processes

| | | Option A | Option B |
|---|---|---|---|
| 1 | Process type | Dual damascene | Single damascene |
| 2 | Pattern sequence | Via first | Trench first |
| 3 | Trench etch stopper | With stop layer | With no stop layer |
| 4 | ILD Planarization | With ILD CMP | With no ILD CMP |
| 5 | ILD/IMD Dielectrics | Same materials | Different materials |

A method for processing IC designs for different metal BEOL processes is provided for enabling fabricating using a metal fabrication process an IC originally having a backend design for a different metal fabrication process. The method first determines layer constructions of an original design of an IC for a first metal backend process, and, based on the layer constructions of the original design of the IC, constructs primitive layer constructions of a target design of the IC for a second metal backend process. The method then tunes an effective dielectric constant of a dielectric layer of the target design to match an associated capacitance of the target backend design with a corresponding capacitance of the original backend design. The method can be used to convert a backend design of an IC from an old metal process (such as Al process) to a new metal process (such as Cu process), without redesigning the IC for the new metal BEOL fabrication process.

The above description, including the specification and drawings, is illustrative and not restrictive. Many variations of the invention will become apparent to those of skill in the art upon review of this disclosure. Various features and aspects of the above-described disclosure may be used individually or jointly. Further, the present disclosure can be utilized in any number of environments and applications beyond those described herein without departing from the broader spirit and scope of the specification. The scope of the invention should, therefore, be determined not with reference to the above description, but instead should be determined with reference to the appended claims along with their full scope of equivalents. In addition, it will be recognized that the terms "comprising," "including," and "having," as used herein, are specifically intended to be read as open-ended terms of art. The term "or" as used herein is not a logic operator in an exclusive sense unless explicitly described as such.

What is claimed is:

1. A method of fabricating an IC comprising:
converting a first backend design having a first metal to a second backend design having a second metal, wherein converting comprises,
obtaining layer construction of the first backend design,
constructing a primitive layer construction for the second backend design based on the layer construction of the first type of backend design,
matching electrical characteristics of the first metal with electrical characteristics of the second metal,
generating a second backend design layout for the second backend design, and
verifying the second backend design layout and correcting violations;
providing a substrate;
frontend processing of the substrate; and
backend processing of the substrate based on the second backend design layout.

2. The method of claim 1 wherein:
the first backend design comprises an aluminum backend process
the first metal comprises aluminum;
the second backend design comprises a copper backend process; and
the second metal comprises copper.

3. The method of claim 1 wherein obtaining layer construction comprises one or more parameters including metal thicknesses, thicknesses of inter-layer dielectric layers (ILD), thicknesses of inter-metal dielectric layers (IMD) and dielectric constant of each dielectric material (ILD or IMD).

4. The method of claim 1 wherein matching electrical characteristics of the first and second metals comprises matching metal resistances of the first and second backend designs.

5. The method of claim 4 wherein matching metal resistances of the first and second backend designs comprises scaling second metal thicknesses.

6. The method of claim 5 wherein scaling second metal thicknesses comprises determining a second metal thickness corresponding to a first metal thickness based on comparing first metal resistivity with second metal resistivity.

7. The method of claim 5 wherein scaling second metal thicknesses comprises determining a second metal thickness corresponding to a first metal thickness based on a simulation result of a model for the second backend design.

8. The method of claim 7 wherein the simulation result is obtained from SPICE model simulation.

9. The method of claim 1 wherein matching electrical characteristics of the first and second metals comprises matching line resistance of line resistors of the first and second backend designs.

10. The method of claim 1 wherein matching electrical characteristics of the first and second metals comprises matching intra-level capacitances of the first backend design with intra-level capacitances of the second backend design.

11. The method of claim 10 wherein matching intra-level capacitances of the first backend design with intra-level capacitances of the second backend design comprises tuning an effective dielectric constant of intra-metal dielectric layers.

12. The method of claim 11 wherein tuning the effective dielectric constant of intra-metal dielectric layers comprises adjusting a thickness of a nitride layer.

13. The method of claim 11 wherein tuning the effective dielectric constant of intra-metal dielectric layers comprises inserting a nitride layer having a calculated thickness.

14. The method of claim 1 wherein matching electrical characteristics of the first and second metals comprises matching inter-level capacitances of the first backend design with inter-level capacitances of the second backend design.

15. The method of claim 14 wherein matching inter-metal capacitance of the first and second backend designs comprises tuning an effective dielectric constant of inter-metal dielectric layers.

16. The method of claim 15 wherein tuning the effective dielectric constant of the inter-metal dielectric layers comprises adjusting a thickness of a dielectric layer.

17. The method of claim 1 wherein converting the first backend design to the second backend design further comprises verifying the second backend design layout by a second process layout design rule checking tool and correcting violations if any determined by the second process layout design rule checking tool.

18. The method of claim 17 wherein verifying the second backend design comprises identifying any violations from one or more of:
   a maximum metal width rule or a maximum metal density rule;
   a minimum metal width rule or a minimum metal density rule; and
   a metal size rule, a via size rule, a metal-metal spacing rule, a metal-via spacing rule, a minimum via/metal enclosure rule, or a minimum metal/via overlay rule.

19. The method of claim 18, wherein correcting the violations identified by a maximum metal width rule or a maximum metal density rule comprises slotting a portion of Cu metallization involved in the violation.

20. The method of claim 18, wherein correcting the violations identified by the maximum metal width rule or a maximum metal density rule comprises adjusting a second metal thickness determined by matching metal resistances of the first and second backend designs.

21. The method of claim 18, wherein correcting the violations identified by the minimum metal width rule or a minimum metal density rule comprises inserting dummy second metallization.

22. The method of claim 1 wherein converting the first backend design to the second backend design further comprises optical proximity correction of the second backend design layout.

23. The method of claim 1 wherein converting the first backend design to the second backend design further comprises mask layer generation based on the second backend design layout.

24. A method of fabricating an IC using a second backend design employing a second metal, wherein the IC originally is based on a first backend design employing a first metal, the method comprising:
   providing a first backend design;
   obtaining layer construction of the first backend design;
   matching electrical characteristics of the first metal with electrical characteristics of the second metal;
   generating an intermediate second backend design layout for the second backend design;
   verifying the second intermediate design layout;
   correcting violations, if any, determined by verifying the intermediate second design layout;
   generating final second design layout; and
   fabricating the IC based on the final second design layout.

25. The method of claim 24 wherein if no violations are determined by verifying the intermediate second design layout, the intermediate second design layout serves as the final second design layout.

26. The method of claim 24 wherein:
   the first backend design comprises an aluminum backend process;
   the first metal comprises aluminum;
   the second backend design comprises a copper backend process; and
   the second metal comprises copper.

27. A method of converting a first backend design of an IC to a second backend design, the method comprises:
   providing a first backend design;
   obtaining layer construction of the first backend design, wherein the layer construction comprises one or more parameters including metal thicknesses, thicknesses of ILDs, thicknesses of IMDs and dielectric constants of dielectric materials of ILDs and IMDs;
   matching electrical characteristics of the first metal with electrical characteristics of the second metal;
   verifying the second backend design;
   correcting violations, if any, determined by verifying the intermediate second design layout;
   generating a second design layout; and
   fabricating the IC based on the final second design layout.

28. The method of claim 27 wherein:
   the first backend design comprises an aluminum backend process;
   the first metal comprises aluminum;
   the second backend design comprises a copper backend process; and
   the second metal comprises copper.

29. A method of fabricating an IC comprising:
   converting a first backend design having a first metal to a second backend design having a second metal, wherein converting comprises,
      obtaining layer construction of the first backend design,
      constructing a primitive layer construction for the second backend design based on the layer construction of the first type of backend design,
      matching electrical characteristics of the first metal with electrical characteristics of the second metal, and
      generating a second backend design layout for the second backend design;
   providing a substrate;
   frontend processing of the substrate; and
   backend processing of the substrate based on the second backend design layout.

* * * * *